United States Patent
McCasland et al.

(10) Patent No.: US 8,552,709 B2
(45) Date of Patent: Oct. 8, 2013

(54) SYSTEMS AND METHODS FOR LOCATING A CIRCUIT

(75) Inventors: Steven Thomas McCasland, Highlands Ranch, CO (US); Thomas A. McCasland, Evergreen, CO (US)

(73) Assignee: Tasco Inc., Englewood, CO (US)

( * ) Notice: Subject to any disclaimer, the term of this patent is extended or adjusted under 35 U.S.C. 154(b) by 1948 days.

(21) Appl. No.: 11/052,340

(22) Filed: Feb. 7, 2005

(65) Prior Publication Data
US 2013/0082679 A1    Apr. 4, 2013

Related U.S. Application Data

(60) Provisional application No. 60/545,611, filed on Feb. 18, 2004.

(51) Int. Cl.
*G01R 19/00*    (2006.01)

(52) U.S. Cl.
USPC .............................. 324/66; 324/67; 324/528

(58) Field of Classification Search
USPC ...................................................... 324/66, 67
See application file for complete search history.

(56) References Cited

U.S. PATENT DOCUMENTS

| | | | | |
|---|---|---|---|---|
| 4,131,844 A * | 12/1978 | Hucker et al. | ......... | 323/263 |
| 4,556,839 A | 12/1985 | George | ......... | 324/66 |
| 4,775,832 A | 10/1988 | Pecukonis | ......... | 324/67 |
| 4,937,519 A * | 6/1990 | Fields, III | ......... | 324/66 |
| 5,361,029 A * | 11/1994 | Rider et al. | ......... | 324/326 |
| 5,422,564 A | 6/1995 | Earle et al. | ......... | 324/67 |
| 5,497,094 A | 3/1996 | George | ......... | 324/529 |
| 5,969,516 A | 10/1999 | Wottrich | ......... | 324/67 |
| 6,054,931 A | 4/2000 | Wottrich | ......... | 340/638 |
| 6,163,144 A * | 12/2000 | Steber et al. | ......... | 324/67 |
| 6,222,358 B1 | 4/2001 | Wottrich | ......... | 324/67 |
| 6,392,395 B2 | 5/2002 | Roberts et al. | ......... | 324/66 |
| 6,566,769 B1 * | 5/2003 | Layton | ......... | 307/147 |
| 6,646,447 B2 * | 11/2003 | Cern et al. | ......... | 324/539 |
| 6,734,682 B2 * | 5/2004 | Tallman et al. | ......... | 324/528 |
| 2004/0000898 A1 * | 1/2004 | Pool et al. | ......... | 324/66 |

* cited by examiner

*Primary Examiner* — Minh N Tang
(74) *Attorney, Agent, or Firm* — Duft Bornsen & Fettig LLP (57) ABSTRACT

Systems and methods presented herein locate and/or identify a circuit within an electrical system. In one embodiment, a transmitter is configured for inducing signals upon a plurality of circuit lines (e.g., power lines, communication lines, lighting circuits, etc.) with each circuit line having a unique signal to identify it from other circuit lines. Each signal may be induced upon an individual circuit line by a inductive coupling clip coupled about the circuit line. The transmitter may be used at a distribution point of the circuit lines, such as circuit breaker box. A receiver can then receive a signal from a distal point on the circuit line to acquire the unique signal induced thereon and identify determine which inductive coupling clip is coupled thereto. For example. the signal may be decoded to display a number of the circuit line being tested.

8 Claims, 10 Drawing Sheets

SYSTEMS AND METHODS FOR LOCATING A CIRCUIT

CROSS-REFERENCE TO RELATED APPLICATIONS

This application claims priority to and the benefit of an earlier filing date from U.S. Provisional Patent Application No. 60/545,611 (filed Feb. 17, 2004), the entire contents of which are incorporated herein by reference.

BACKGROUND OF THE INVENTION

1. Field of the Invention

The invention generally relates to circuit line detection systems and, more specifically, to determining circuit configurations and/or locations from a common node point, such as an electric circuit breaker box.

2. Discussion of the Related Art

Circuit location and identification becomes increasingly difficult as the number of circuit lines increases and the circuits themselves become more complex. For example, large office buildings have exceptionally large electric cabling and electronic cabling requirements. The electric cabling and electronic cabling requirements of these office buildings frequently change because the needs of the tenants often change. When a tenant desires a change office space functionality (e.g., power, communications, lighting, etc.), an electrician is often tasked to reconfigure the cabling systems of the office building to accommodate the tenant's needs. These changing requirements often result in more complex circuital systems with certain circuit lines becoming unidentifiable.

Such changing electric cabling and electronic cabling needs are not limited to office buildings, however. Homes and industrial buildings also have changing electric cabling and electronic cabling requirements due to improvements and/or modifications to such structures. For example, a homeowner may wish to add another power outlet to a particular location in the home. As most homes are configured with at least one circuit breaker box in which all power lines are centrally connected, the homeowner (typically through the assistance of an electrician) may run a line from the desired power outlet to a circuit breaker within the breaker box. As is often the case, the connection of this new line, as well as connections of existing lines, to a circuit breaker box is unidentifiable and/or mislabeled.

Certain methods exist for identifying circuit lines within the system. For example, one typical manner in which a power line of a power outlet can be identified includes positioning a person (e.g., an electrician) at a circuit breaker box and another person at the power outlet. The person located at the power outlet may use a test device (e.g., a test light that plugs into the outlet) while the person positioned at the circuit breaker box arbitrarily "flips" circuit breakers until the person at the power outlet communicates that the circuit breaker has been identified. This process is a time-consuming process that utilizes multiple people (e.g., two times a number of man-hours to identify a circuit). Moreover, many organizations (e.g., those which run electronic business systems, electronic hospital systems, computing systems, etc.) cannot afford a power loss while a circuit breaker is being "flipped", or tested.

BRIEF SUMMARY OF THE INVENTION

Systems and methods presented herein are generally directed to the location and/or identification of a circuit within a circuital system. In one embodiment, a transmitter is configured for inducing one or more signals, each comprising a circuit indicator, upon a one or more circuit lines (e.g., power lines, communication lines, lighting circuits, etc.). For example, each signal may be used to identify one circuit line from other circuit lines under test.

Each signal may be induced upon an individual circuit line by means of an inductive coupling clip coupled about the circuit line. The transmitter may be used at a distribution point of the circuit lines, such as circuit breaker box. A receiver can then receive a signal from a distal point on the circuit line to acquire the unique signal induced thereon and identify and/or determine which inductive coupling clip is coupled thereto. For example, the receiver may extract the circuit indicator from the signal to display the circuit line being tested.

The circuit indicator may be of various types of electric and/or electromagnetic signals. For example, the circuit indicator may be the signal having a unique signal strength, a unique frequency, a unique modulation or a combination thereof conveyed upon a circuit line by the transmitter. The signal may be either induced upon a circuit line by means of an inductive coupling and/or electrically coupled to the circuit line. The circuit indicator may include a code character, such as an American Standard Code for Information Interchange ("ASCII") character, conveying a numeral, a letter or a combination thereof. In a preferred embodiment, a circuit indicator is an ASCII character conveying a numeral which corresponds to a numbered output of the transmitter. For example, the transmitter may have a plurality of outputs each of which is sequentially numbered. An inductive coupling clip may be electrically connected to the transmitter to receive a signal conveying an ASCII character directly associated with the output of the transmitter. The inductive coupling thereby induces that ASCII number upon a circuit line under test.

One object of the present invention is to provide a method of identifying individual electrical conductors from a plurality of similar conductors without disrupting service.

Another object of the present invention is to provide a rapid method of identification of individual conductors in an electrical wiring system by means of a device that requires no physical connection to the conductors being tested.

Another object of the present invention is to provide a means of identifying telephone wiring configurations by means of an apparatus that will not interrupt service.

Another object of the present invention is to provide a means of identifying individual electrical conductors that will work on "dead", powered, or open wires.

Another object of the present invention is to provide a means of identifying individual conductors using a device that requires only one location of signal coupling such as at a circuit breaker panel or wiring distribution box.

Another object of the present invention is to provide a method of verification of electrical wiring to verify accuracy of wiring diagrams.

Another object of the present invention is to provide a method of creating wiring diagrams of legacy wiring configurations.

Another object of the present invention is to provide a method of determining whether neutral conductors of two or more wires of an electrical wiring system have been inadvertently connected.

Another object of the present invention is to provide a method of preventing signals in a wiring system from interfering with each other or coupling with other wires by use of a capacitive decoupling method.

Another object of the present invention is to provide a method of determining which circuit breaker in an electrical distribution system is "feeding" outlets in individual rooms without having to relocate, reconnect and/or reconfigure a transmitting device.

Another object of the present invention is to provide a method of testing a plurality of conductors in a system using multiple transmitters and a single receiving device.

In one embodiment of the invention, a system for determining a circuit configuration includes a transmitter communicatively coupled to at least one circuit for transmitting a circuit indicator with the circuit. The system also includes a receiver configured for coupling to the circuit at a distal point from the transmitter and for receiving the circuit indicator to identify the at least one circuit.

The transmitter may include a clip configured for inducing a signal with the circuit, wherein the signal comprises the circuit indicator. The circuit indicator may be a number, a unique frequency, a unique modulation, a unique ASCII character, a unique signal strength, or a combination thereof. The transmitter may include a processor configured for generating the circuit indicator for induction upon the at least one circuit.

The receiver may include a processor configured for receiving and processing a circuit indicator to determine the circuit line under test. For example, the receiver may decode an ASCII code character to determine the circuit line. After processing the circuit indicator, the receiver may display the circuit indicator through a display unit such as a Light Emitting Diode ("LED") or a Liquid Crystal Display ("LCD").

The circuit line may be configured with a circuit breaker. For example, the circuit breaker may receive power and perform as a central distribution point for transferring that power to power outlets throughout a structure such as an office building. Transmitter may transmit the circuit indicator along the circuit line and others configured therewith such that a receiver may be used to detect each circuit line. However, the transmitter may be used with other types of lines such as those in a lighting system, a communication network and metal plumbing.

In another embodiment, the system includes a balancer configured for coupling one or more oscillating signals to ground. Examples of such signals include two phase and three phase AC power used in household and industrial applications, respectively. The balancer may be configured either independently of the transmitter or with the transmitter.

In one embodiment of the invention, a method of detecting a circuit includes generating a circuit indicator, inducing a signal comprising the circuit indicator at a first point of the circuit, and detecting the signal at a second point of the circuit to acquire the circuit indicator. Inducing the signal may include transferring the signal to the circuit through an inductive coupling. To convey the circuit indicator, the method may further include configuring the circuit indicator upon the signal. For example, the circuit indicator may be modulated upon the signal as an ASCII character using amplitude modulation.

Detecting the signal at a second point of the circuit may include receiving the signal with a handheld device and demodulating the signal with the handheld device to extract the circuit indicator. For example, the circuit indicator may be a number, a unique frequency, a unique modulation, a unique ASCII character, a unique signal strength, or a combination thereof. The handheld device may be a receiver that demodulates and/or decodes the signal to extract the relevant information thereof to identify a particular circuit line. Afterwards, the handheld device may be used to display the circuit indicator.

DETAILED DESCRIPTION OF THE DRAWINGS

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

Figure 1:
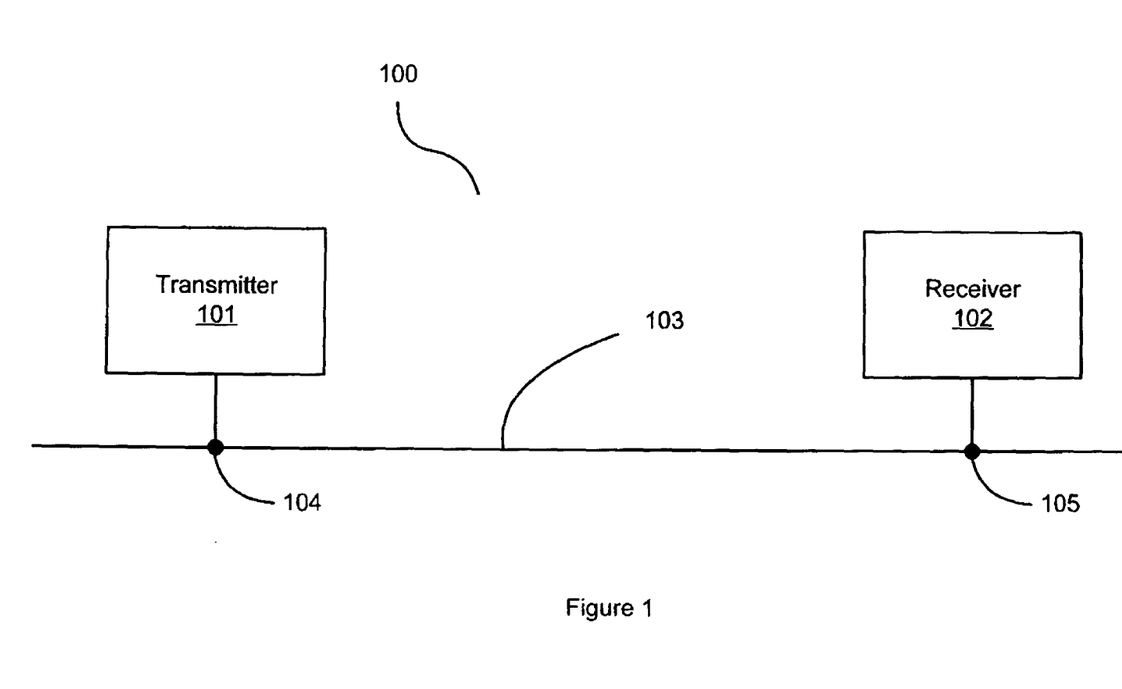
FIG. 1 is a block diagram of a circuit mapping system, in one exemplary embodiment of the invention.

FIG. 1 is a block diagram of a circuit mapping system ("CMS") 100, in one exemplary embodiment of the invention. In this embodiment, CMS 100 is configured with a transmitter 101 and a receiver 102 which are used to map (e.g., identify and/or locate) circuit line 103. For example, in complex circuitry systems, circuit lines may become mislabeled and/or unidentifiable due to the number of circuit lines in the system. CMS 100 may improve identification and/or location of such circuit lines by transferring a circuit indicator along circuit line 103.

Transmitter 101 may be coupled to circuit line 103 at node 104 to transfer the circuit indicator along circuit line 103. For example, transmitter 101 may coupled to circuit line 103 via an inductive coupling such that transmitter 101 may induce a signal upon circuit line 103. Receiver 102 is configured for receiving the signal and extracting the circuit indicator therefrom. In one embodiment, transmitter 101 modulates an ASCII character (e.g., numbers, letters or combinations thereof) upon a carrier signal (e.g., using modulation techniques such as amplitude modulation, frequency modulation, phase modulation, etc.), which is subsequently induced upon circuit line 103 through the inductive coupling. Receiver 102 may demodulate the signal to extract the ASCII character. Receiver 102 may comprise a microprocessor and a display unit, such as an LED or an LCD, to process the ASCII character and display it with the display unit. Those skilled in the art should readily recognize that other coding systems may be used to convey information regarding a circuit line under test.

As such, the invention is not intended to be limited to the coding technique or even the indicator that is conveyed therefrom.

CMS 100 may provide certain advantages in identifying and locating circuit lines of a complex circuit system, such as those found in buildings requiring substantial amounts of electric cabling and/or electronic cabling. For example, large office buildings typically require large amounts of electric cabling and electronic cabling for tenants' power and communication needs. As these needs may change, CMS 100 may be used to locate and/or identify circuit lines of such circuital systems more rapidly than the methods of the prior art (e.g., flipping circuit breakers). Additionally, operation of CMS 100 may advantageously reduce the number of people required to locate/identify circuit lines of the system. For example, one person (e.g., an electrician) may couple transmitter 101 to circuit lines coming into a central power distribution point, such as a circuit breaker box. That person may then move throughout a building with a handheld receiver device (e.g., receiver 102) to probe power outlets (e.g., wall sockets) and determine a circuit breaker to which a particular power outlet is connected.

Figure 2:
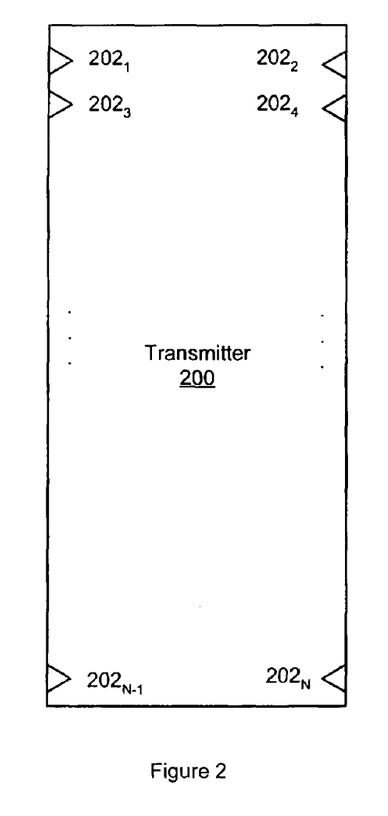
FIG. 2 is a block diagram of a transmitter for use with a circuit mapping system, in one exemplary embodiment of the invention.

FIG. 2 is a block diagram of a transmitter 200 for use with a circuit mapping system such as CMS 100 of FIG. 1, in one exemplary embodiment of the invention. In this embodiment, transmitter 200 includes a plurality of output couplings 202. Transmitter 200 is configured for generating a unique indicator, such as an ASCII character, and modulating that indicator upon a carrier signal to form a unique modulated signal. Each unique modulated signal is transferred to a corresponding output coupling 202. Coupling clips are coupled to output couplings 202, each of which is used to induce a unique signal upon a circuit line, such as circuit line 103 of FIG. 1. Such coupling clips are explained in greater detail below in FIG. 4.

In one embodiment of the invention, transmitter 200 may be used to map (e.g., identify/locate) circuit lines coming into a circuit breaker box. Circuit breaker boxes are typically limited in the number of circuit breakers they can contain (e.g., typical electrical standards require a maximum of 42 circuit breakers per box). Transmitter 200 may be configured with a number of output couplings 202 that accommodates testing of each of the circuit breakers, or some subset thereof. Although transmitter 200 may be used to map circuit lines of the circuit breaker box, the invention is not intended to be limited to such mapping. For example, transmitter 200 may be configured to map a variety of circuit lines, such as communication lines (e.g., category 1 through 7 cables, Ethernet cables, Universal Serial Bus cables, etc.) and lighting system wiring. Additionally, transmitter 200 may be used to map other systems that have conductive components, such as plumbing.

Figure 3:
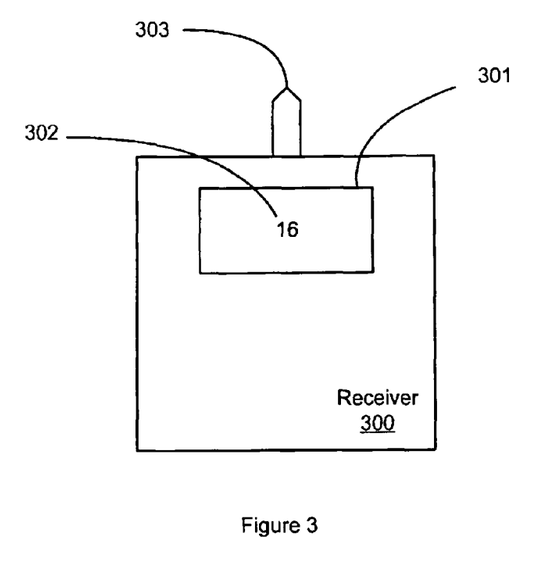
FIG. 3 is a block diagram of a receiver for use with a circuit mapping system, in one exemplary embodiment of the invention.

FIG. 3 is a block diagram of a receiver 300 for use with a circuit mapping system, such as CMS 100 of FIG. 1, in one exemplary embodiment of the invention. In this embodiment, receiver 300 is configured with a probe 303 which is used to detect a signal from transmitter 200 of FIG. 2. For example, probe 303 may be inserted into a power outlet to receive a signal from transmitter 200 via a circuit line coupled thereto. For example, transmitter 200 may induce a signal upon a circuit line at a circuit breaker box as described above in FIG. 3. Probe 303 may be inserted into a power outlet electrically connected to the circuit line to receive the signal from transmitter 200. Receiver 200 may process a received signal to extract a circuit indicator 302 from the signal, such as an ASCII character modulated thereon. Once processed, receiver 300 may display the circuit indicator 302 be a display unit 301.

As exemplarily illustrated in this embodiment, the number 16 is displayed within display unit 301. The number 16 of this example corresponds to the sixteenth output coupling 202 of transmitter 200. Accordingly, a user of receiver 300 may identify a particular circuit line connection to a circuit breaker of a power outlet without the assistance of other people and/or devices.

In one embodiment of the invention, probe 303 is not required to be inserted into a circuit line. Receiver 300 may be configured such that probe 303 senses a signal of transmitter 200 proximate to a circuit line under evaluation. For example, as the signal of transmitter 200 may be induced upon a circuit line, receiver 300 may be configured to sense the signal through inductive means. Those skilled in the art are readily familiar with such sensing techniques. Accordingly, invention should not be limited to the embodiment shown and described herein.

Figure 4:
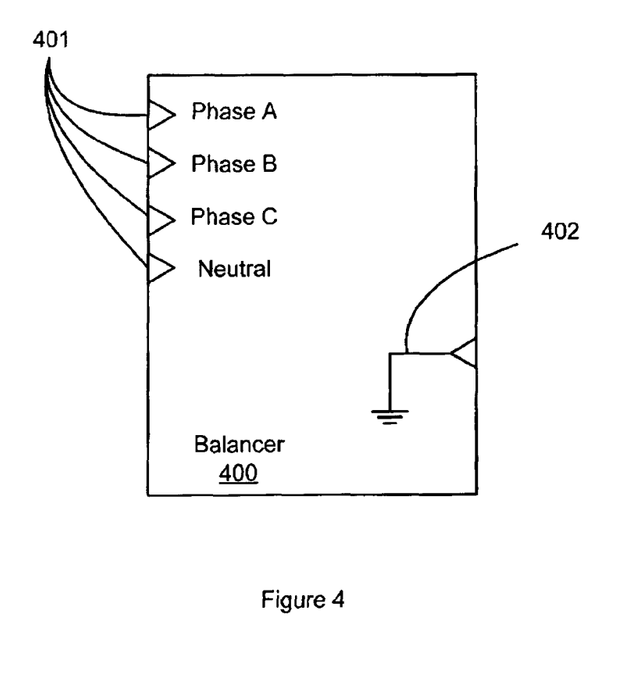
FIG. 4 is a block diagram of a balancer for use with a circuit mapping system, in one exemplary embodiment of the invention.

FIG. 4 is a block diagram of a balancer 400 for use with a circuit mapping system, such as CMS 100 of FIG. 1, in one exemplary embodiment of the invention. In this embodiment, balancer 400 is configured for receiving one or more power line inputs 401 "filtering out" certain frequency components of such inputs to substantially reduce crosstalk between inductive couplings of circuit lines. For example, common industrial power systems of the United States deliver 120 volt (V), three-phase, 60 hertz (Hz) AC power (i.e., each power signal being separated in phase by 120° as is well-known to those skilled in the art). This three-phase power is delivered to a central distribution point (e.g., a circuit breaker box) of a structure via power lines. The three-phase power is also delivered with a phase neutral signal, or ground. In this embodiment, balancer 400 is configured for receiving these power signals with inputs 401 to conduct the power signals to ground 402 such that the frequency components of the delivered AC power do not induce signals upon other circuit lines (i.e., crosstalk). Other examples of power delivery in which balancer 400 may be used include the delivery of 120V two phase AC power at 60 Hz, such as that of common household power. In such power delivery, balancer 400 may be configured for coupling the two phase power signals to ground by simply using two of the power line inputs 401.

In one embodiment, balancer 400 may be integrated with transmitter 200 such that transmitter 200 comprises the functionality of balancer 400. Additionally, balancer 400 may be configured to receive a single phase power input. For example, in a single phase AC power delivery, the power signal comprises AC power of one phase at one frequency (e.g., 60 Hz. Balancer 400 may be configured to filter out these frequency components of the single phase AC power signal by using one of the power line inputs 401. Accordingly, the invention should not be limited to any particular power delivery scheme. Moreover, balancer 400 may be an alternative feature of the circuit mapping system. For example, since transmitter 200 may be used to induce signals upon other types of circuit lines, such as communication lines, that typically operate on Direct Current ("DC"), the features of balancer 400 may not be used.

Figure 5:
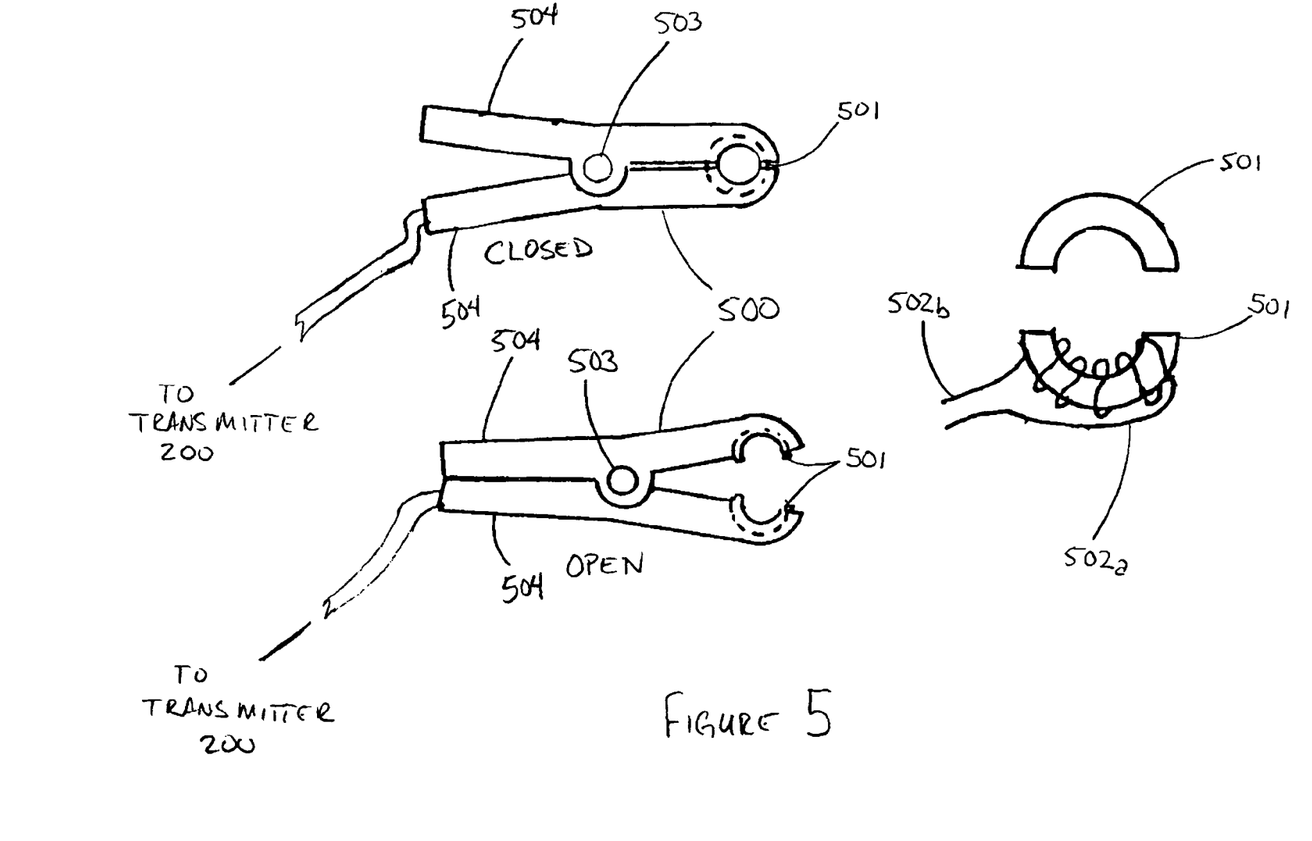
FIG. 5 is an illustration of a coupling clip, in one exemplary embodiment of the invention.

FIG. 5 is an illustration of a coupling clip 500, in one exemplary embodiment of the invention. In this embodiment, coupling clip 500 is configured for receiving a signal from transmitter 200 of FIG. 2 and inducing the signal upon a circuit to which coupling clip 500 is coupled. For example, coupling clip 500 may coupled to one of the output couplings 202 of FIG. 2 to receive a signal modulated with a circuit indicator, such as an ASCII character. Coupling clip 500 may induce that modulated signal upon a circuit line coupled through a toroid form by metal cores 501 when coupling clip 500 is closed.

Coupling of 500 is configured as a spring actuated clip that opens with respect to hinge 503 when handles 504 are compressed. Configured with coupling clip 500 are metal cores 501. Metal cores 501 are typically enveloped with a dielectric material and wrapped with a metal wire 502, such that the wire 502 may conduct electric current through 502*a* to 502*b*. Such electric current conduction through the wire 502 may induce a current through metal core 501. For example, when coupling clip 500 is closed, metal cores 501 combine to form a toroid with a closed magnetic path, thereby creating a transformer primary with the secondary wire 502 running through the clip. Current through a wire wound about the toroid will induce current within the toroid. This transformer may impress/induce the signal from the transmitter to a circuit line without electrical contact and thus without the need to electrically disturb a circuit line.

Those skilled in the art are readily familiar with the induction of electric current upon a toroid using conductive wires. An example of a material used for metal cores 501 may include iron. An example of a material used for wire 502 may include copper. However, those skilled in the art will readily recognize that other materials may be suitable for such induction and that the selection of materials is often a matter of design choice.

Figure 6:
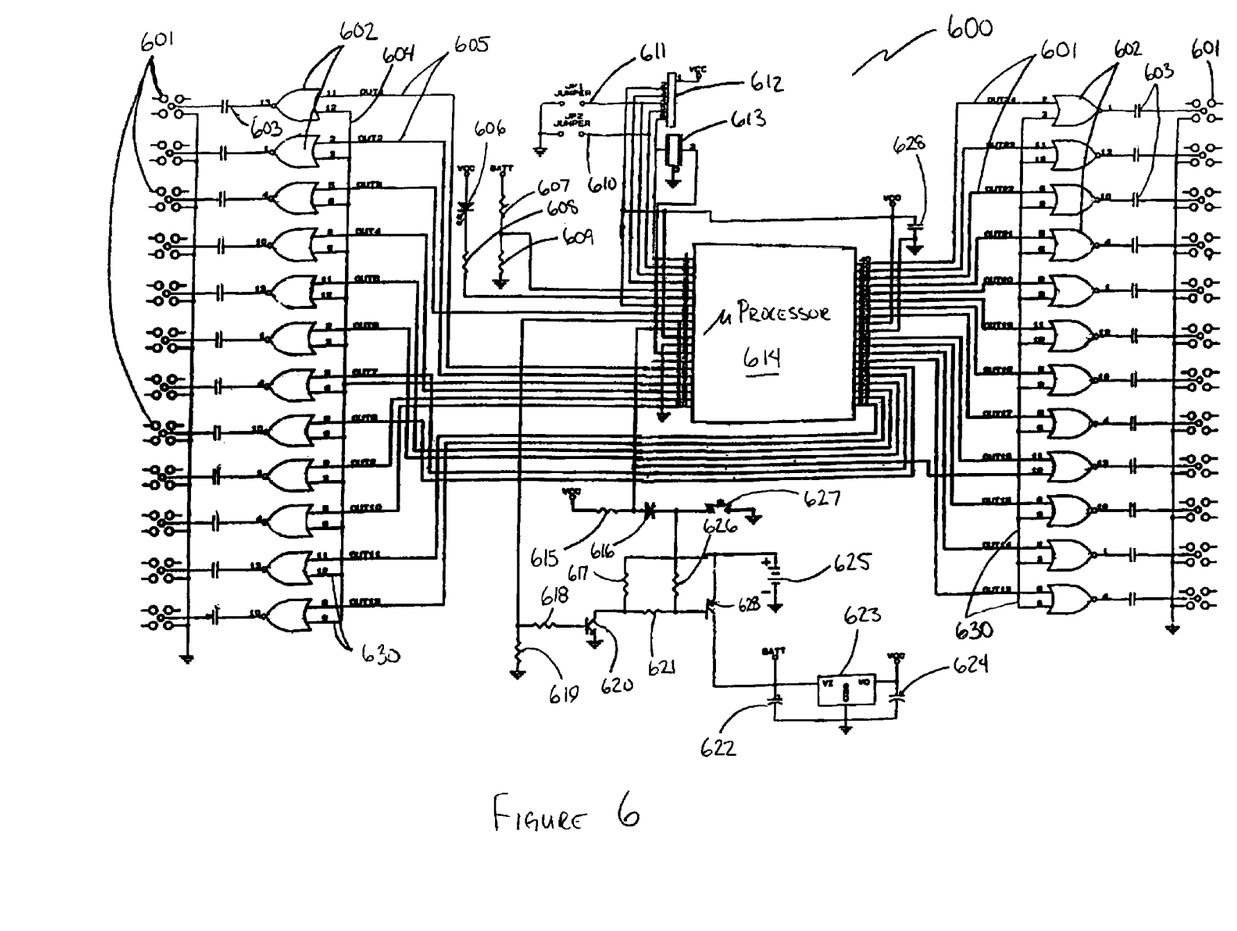
FIG. 6 is a circuit diagram of a transmitter, in one exemplary preferred embodiment of the invention.

FIG. 6 is a circuit diagram of a transmitter 600, in one exemplary preferred embodiment of the invention. In this embodiment, transmitter 600 is configured for generating a unique circuit indicator for each of the outputs coupling 601. Microprocessor 614 generates each unique circuit indicator and a corresponding signal for modulating each unique circuit indicator thereon. For example, microprocessor 614 generates a carrier signal for each output coupling 601 and amplitude modulates a carrier signal with an ASCII character associated with a particular output coupling 601. Accordingly, each output coupling 601 has a unique output signal associated therewith. This output signal is transferred to a circuit line 103 through an inductive coupling, such as coupling clip 500 of FIG. 5. One example of such a microprocessor 614 includes a PIC16C74A microprocessor from Microchip Technology, Inc.

In this preferred embodiment, transmitter 600 includes a power-on/reset module configured from switch 627, resistor 615, diode 616, resistor 626, resistor 617, battery 625, transistor 628, resistor 621, voltage regulator 623, capacitor 624, capacitor 622, transistor 620, resistor 618 and resistor 619. When closed (e.g., a button that is physically depressed), switch 627 applies a ground potential from the battery 625 through resistor 626 to the base of transistor 628 causing it to conduct electric current to voltage regulator 623. Voltage regulator 623 thereby applies a voltage VCC to microprocessor 614 to cause microprocessor 614 to initialize and apply power to resistors 618 and 619. The voltage at resistors 618 and 619 is supplied to the base of transistor 620 causing resistor 617 to be "pulled" to ground. This also causes a ground potential to be conducted on transistor 628 such that transmitter 600 may remain energized after switch 627 is released. Closing switch 627 again (e.g., subsequently depressing a button on transmitter 600) causes a ground potential through diode 616 to be applied to the microprocessor 614. Microprocessor 614 thereby removes the potential on resistor 618 and 619 such that when switch 627 is released and resistor 615 returns the voltage to VCC, power is removed from the circuitry of transmitter 600.

Transmitter 600 also includes, in this embodiment, clock 613 (e.g., a crystal oscillator) that determines the frequency of microprocessor 614. Additionally, resistors 607 and 609 form a voltage divider that measures voltage of battery 625 using microprocessor 614. For example, microprocessor 614 may perform an analog-to-digital conversion of the voltage of the voltage divider and process that digitally converted voltage to determine if sufficient charge remains in the battery for transmitter 600 to operate. Light emitting diode 606 is powered through resistor 608 to indicate that power being delivered to transmitter 600 is sufficient to operate the transmitter.

To generate codes for the output couplings 601, jumpers 610 and 611 apply a ground potential to pins of microprocessor 614 through pull up resistor network 612. This causes microprocessor 614 to generate ASCII code numbers for each of the output couplings 601. In this embodiment, microprocessor 614 generates 24 ASCII code numbers from an ASCII 1 to an ASCII 24. Other embodiments, may include ASCII code generation of an ASCII 1 through an ASCII 94 depending on the number of output couplings 601 configured with transmitter 600. For example, transmitter 600 may be configured with an application-specific number of output couplings 601. Accordingly, the ASCII code number generation would correspond to the application-specific number of output couplings 601.

Figure 10:
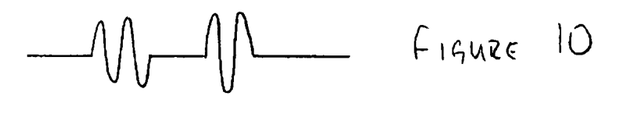
FIGS. 10 through 16 illustrate exemplary signal waveforms processed by a receiver of a circuit mapping system, in one embodiment of the invention.

To illustrate, when jumpers 610 and 611 are connected, microprocessor 614 may generate an ASCII code number and transfer that number via an output line 605 to a driver 602 (e.g. a NOR gate). Microprocessor 614 may repeat this operation for each output coupling 601 configured with transmitter 600. The ASCII code numbers are modulated by a carrier signal (e.g., 150 kHz) applied to a terminal of driver 602 via line 630. The modulated signal is then transferred to an output coupling 601 associated with driver 602. An example of such a modulated signal transferred via output coupling 601 is illustrated in FIG. 10.

While one exemplary preferred embodiment has been shown and described herein, those skilled in the art should readily recognize that transmitter 600 may be configured in other ways that fall within the scope and spirit of the invention. For example, component selection and/or hardware configuration are often a matter of design choice. Those skilled in the art may configure a transmitter that differs in configuration from the preferred embodiment yet still operates in accordance with the principles of the invention described hereinabove. Accordingly, invention is not intended be limited to exemplary preferred transmitter embodiment shown and described herein.

Figure 7:
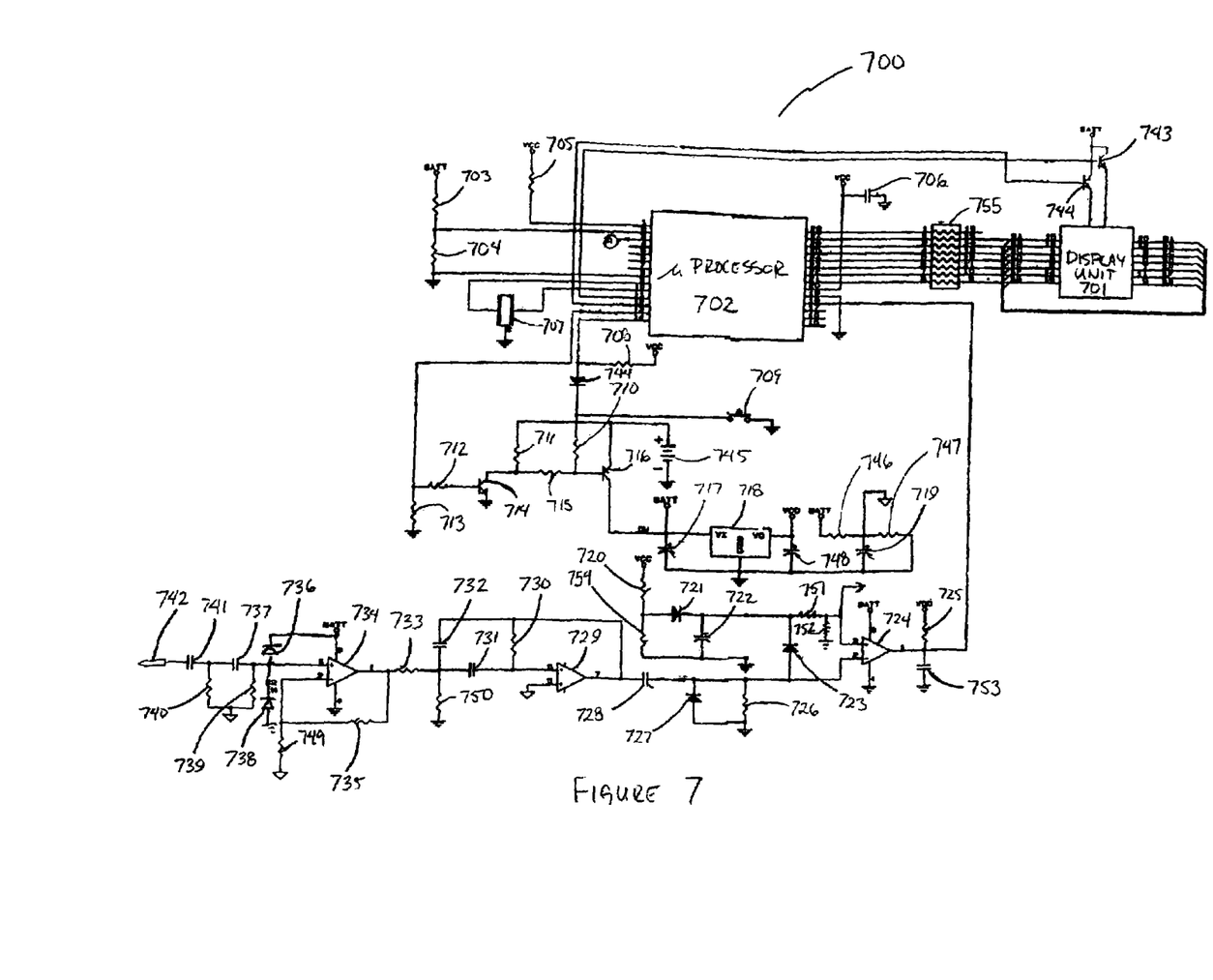
FIG. 7 is a circuit diagram of a receiver, in one exemplary preferred embodiment of the invention.

FIG. 7 is a circuit diagram of a receiver 700, in one exemplary preferred embodiment of the invention. Receiver 700 is configured for receiving a signal transmitted by a transmitter (e.g., transmitter 600 of FIG. 6) via a circuit line, such as circuit line 103 of FIG. 1. Receiver 700 receives the signal via electrode 742. Receiver 700 processes the received signal via microprocessor 702 to extract a circuit indicator from the circuit line. For example, receiver 700 may demodulate a signal from transmitter 600 to detect the circuit indicator. Once extracted, microprocessor 702 may transfer the circuit indicator to display unit 701 for the display thereof. One example of such a microprocessor 702 includes a PIC16C73A microprocessor from Microchip Technology, Inc.

In this embodiment, receiver 700 comprises a power-on/reset configuration configured from resistor 712, resistor 713, resistor 711, resistor 715, resistor 710, transistor 714, diode 744, resistor 708, switch 709, transistor 716, battery 745, capacitor 717, voltage regulator 718, capacitor 748, resistor 746, capacitor 719 and resistor 747. The power-on/reset configuration illustrated herein is structurally and methodically similar to the power-on/reset configuration of transmitter 600.

In this embodiment, probe 742 is either connected directly to, or held in the proximity of the circuit line conveying a modulated input signal transferred by a transmitter. A signal conditioning/demodulation section (e.g., formed by capacitor 741, capacitor 737, resistor 740, resistor 739, diode 736, diode 738, resistor 749, resistor 735, operational amplifier 734, resistor 733, capacitor 732, resistor 750, capacitor 731, resistor 730 and operational amplifier 729) may be used to amplify a received signal and filter unwanted frequencies (e.g., using capacitor 741, capacitor 737, resistor 740 and resistor 739 to filter 60 Hz AC) to enhance signal quality and subsequent processing of the received signal. Diode 736 and 738 are configured to prevent input voltage from damaging integrated circuitry of receiver 700. Resistor 733, capacitor 732, resistor 750, capacitor 731, resistor 730 and operational amplifier 729 form a band pass filter to eliminate unwanted frequencies and further amplify the signal.

Figure 11:
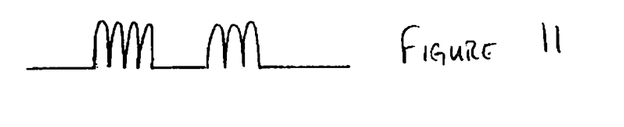
Figure 12:
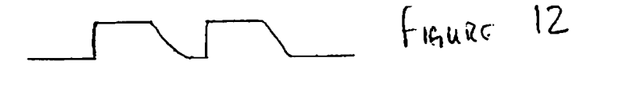
Figure 13:
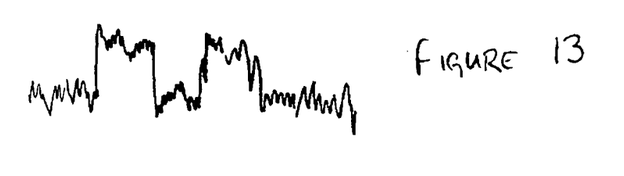

Capacitor 728, diode 727 and resistor 726 rectify the received signal and perform an envelope detection. An example of a rectified signal as rectified by capacitor 728, diode 747 and resistor 726 is illustrated in FIG. 11 whereas an example of an envelope detected signal is illustrated in FIG. 12. A rectified signal is transferred to comparator 724, which compares the rectified signal to a minimum baseline voltage. The minimum baseline voltage is, in essence, a bias voltage from resistors 720 and 754 applied to capacitor 722 through diode 721 to "feed" comparator 724. An example of this minimum baseline voltage prior to filtering by diode 721 may be a mid point between high and low voltage levels on the signal of FIG. 13 such that the bias level may vary with the amplitude of the incoming rectified signal. Resistors 751 and 752 scale the voltage for input to comparator 724.

Figure 14:
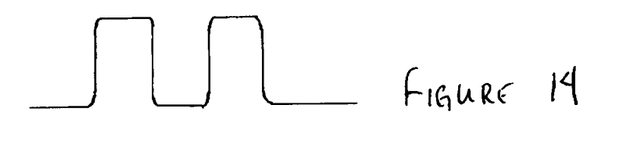

In this embodiment, the bias voltage may be used to "clip" lower amplitude noise and pass the higher amplitude signal, resulting in a signal such as that illustrated in FIG. 14. The minimum baseline voltage may be compared to the rectified signal via comparator 724 to determine whether a signal is present at electrode 742. Accordingly, the bias voltage may be used to "find" a signal by passing only the signal which is greater than the bias level.

Figure 15:
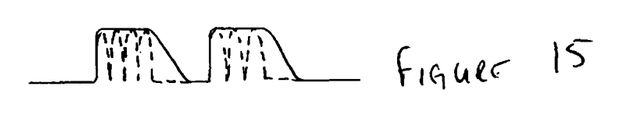
Figure 16:
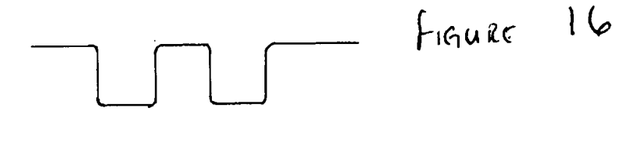

Comparator 724 compares the rectified/envelope detected signal to the minimum baseline voltage to condition the signal for processing by microprocessor 702. For example, comparator 724 may perform a comparison as exemplarily illustrated in FIG. 15. The output of comparator 724 (e.g., via resistor 725 and capacitor 753) may be an inverted waveform of the comparison of FIG. 15. This inverted waveform is exemplarily illustrated in FIG. 16.

Once the signal conditioning/demodulation hereinabove is performed, microprocessor 702 may determine whether the received code (e.g., the waveform of FIG. 16) equates to a recognizable ASCII number. If microprocessor 702 validates the received code, microprocessor 702 may then store the signal strength associated with this code. After receiving a certain number of such codes, microprocessor 702 may determine which of the codes has the strongest signal strength. Microprocessor 702 may subsequently process the strongest code and transfer the code to display unit 701 via resistor network 755.

The arrow located near resistors 751 and 752 illustrates a connection to a "pin" of microprocessor 702. This connection is configured for sending an envelope detected signal to microprocessor 702. Signals transferred via this connection are stored and measured such that the highest amplitude signal is displayed with the lower amplitude signals being discarded. Such may be performed to reduce the likelihood of cross talk signals being displayed. For example, cross talk signals are typically of lower amplitude than a signal of interest. Using only the highest amplitude signal may substantially ensure that the receiver correctly identifies the transmitter coupling to a circuit line.

For example, display unit 701 may be an LED unit configured for receiving signals from a microprocessor, such as microprocessor 702. The resistor network 755 may limit the current flow to the LED. The brightness and multiplexing of the LED may be controlled by microprocessor 702 via transistors 744 and 743. One example such a display unit 701 includes an LTD-482RC LED from LiteOn Trading USA, Inc.

Receiver 700 may also comprise components to perform functions related to maintenance of the microprocessor 702. For example, resistor 705 may be a "pull-up" resistor used to filter and/or prevent interference from noise. Resistors 703 and 704 may monitor battery voltage to ensure the microprocessor 702 may operate properly. Clock 707 (e.g., a crystal oscillator) determines the frequency of microprocessor 702.

While one exemplary preferred embodiment has been shown and described herein, those skilled in the art should readily recognize that receiver 700 may be configured in other ways that fall within the scope and spirit of the invention. Component selection and/or hardware configuration are often a matter of design choice. For example, display unit may be configured as an LED or as an LCD. Accordingly, those skilled in the art may configure a receiver that differs in configuration from the preferred embodiment yet still operates in accordance with the principles of the invention described hereinabove. The invention, therefore, should not be limited to exemplary preferred transmitter embodiment shown and described herein.

Figure 8:
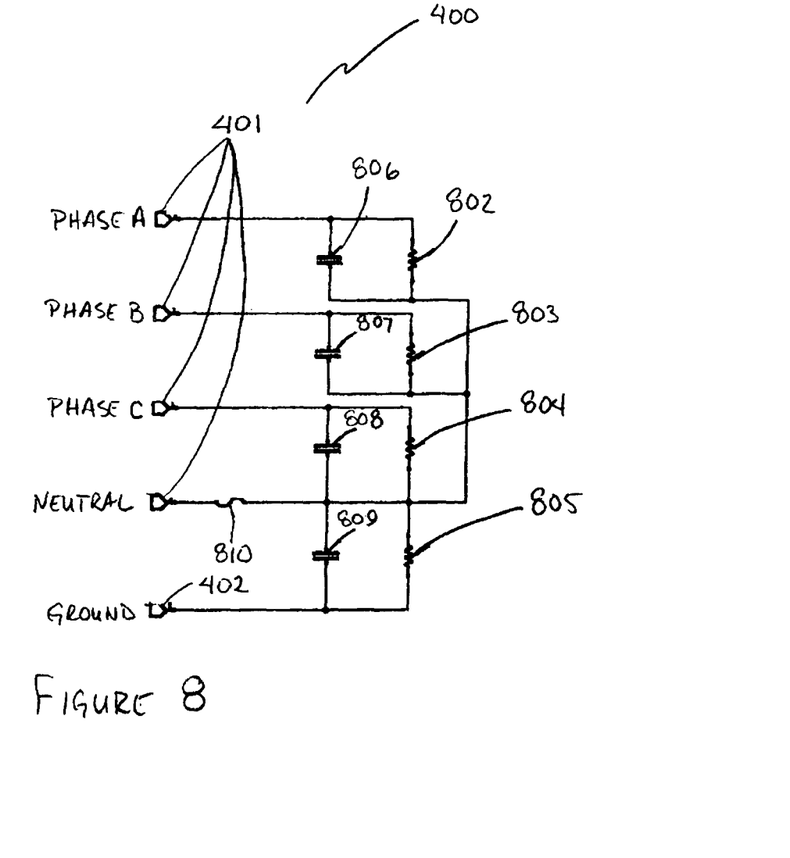
FIG. 8 is a circuit diagram of a balancer, in one exemplary preferred embodiment of the invention.

FIG. 8 is a circuit diagram of a balancer 400, in one exemplary preferred embodiment of the invention. In this embodiment, balancer 400 is configured for receiving AC power via inputs 401. For example, common industrial AC power comprises three phases (e.g., phases A, B and C each offset from the other by 120°) of power signals at 60 Hz as well as a neutral signal. Balancer 400 is configured for receiving such industrial AC power and filtering the signals by coupling them to ground. This filtering may substantially prevent crosstalk between circuit lines under test with a transmitter, such as transmitter 600 of FIG. 6.

Additionally, balancer 400 may comprise other components to improve safety of the transmitter. For example, balancer 400 may comprise capacitors 806, 807, 808 and 809 as well as resistors 802, 803, 804 and 805. Resistors 802, 803, 804 and 805 may respectively discharge capacitors 806, 807, 808 and 809 when balancer 400 is removed from a circuit under test to prevent accidental shock. Balancer 400 may also comprise fuse 810 to substantially prevent damage caused by failure of capacitors 806, 807 and 808.

While one exemplary preferred embodiment has been shown and described herein, those skilled in the art should readily recognize that balancer 400 may be configured in other ways that fall within the scope and spirit of the invention. For example, component selection and/or hardware configuration are often a matter of design choice. Those skilled in the art may configure a balancer that differs in configuration from the preferred embodiment yet still operates in accordance with the principles of the invention described hereinabove. Accordingly, invention is not intended be limited to exemplary preferred balancer embodiment shown and described herein.

Figure 9:
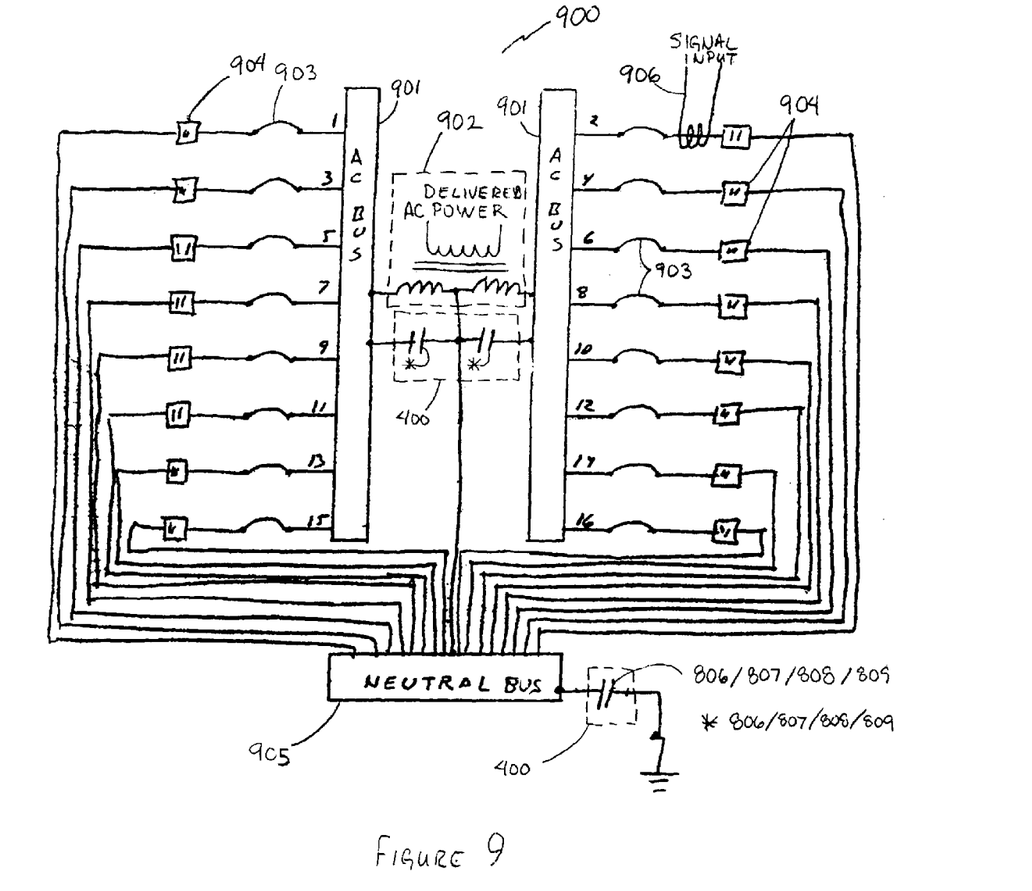
FIG. 9 is a schematic diagram of a circuit mapping system operable with a circuit distribution center, in one exemplary embodiment of the invention.

FIG. 9 is a schematic diagram of a circuit mapping system, such as CMS 100 of FIG. 1, operable with a circuit distribution center 900, in one exemplary embodiment of the invention. In this embodiment, the circuit mapping system induces a signal through an inductive coupling 906, such as that performed by coupling clip 500 of FIG. 5. This signal is applied to power outlet 904 and flows to neutral bus 905. A balancer, such as balancer 400 of FIGS. 4 and 8, couples the signal through a capacitor (e.g., capacitors 806, 807, 808 and 809) to the AC bus 901. This capacitive coupling allows the induced signal to bypass relatively high impedance of AC transformer 902. For example, without the balancer, no signal return path would exist because the path would be blocked by the high impedance of the AC transformer providing power to the circuit breaker panel (e.g., the panel of circuit breakers 903). Such could cause stray induced signals to be coupled onto other circuit lines (i.e., crosstalk) in the panel and result in misidentifications.

As previously described, balancer 400 may not be necessary to a circuit mapping system where circuit lines under test are not AC power lines. For example, the circuit mapping system may be used to test other types of electrically conductive lines, such as communication cables, lighting cables, metal plumbing, DC power lines, etc. However, balancer 400 may improve the circuit mapping of such AC power lines by preventing crosstalk of such power lines.

Figure 17:
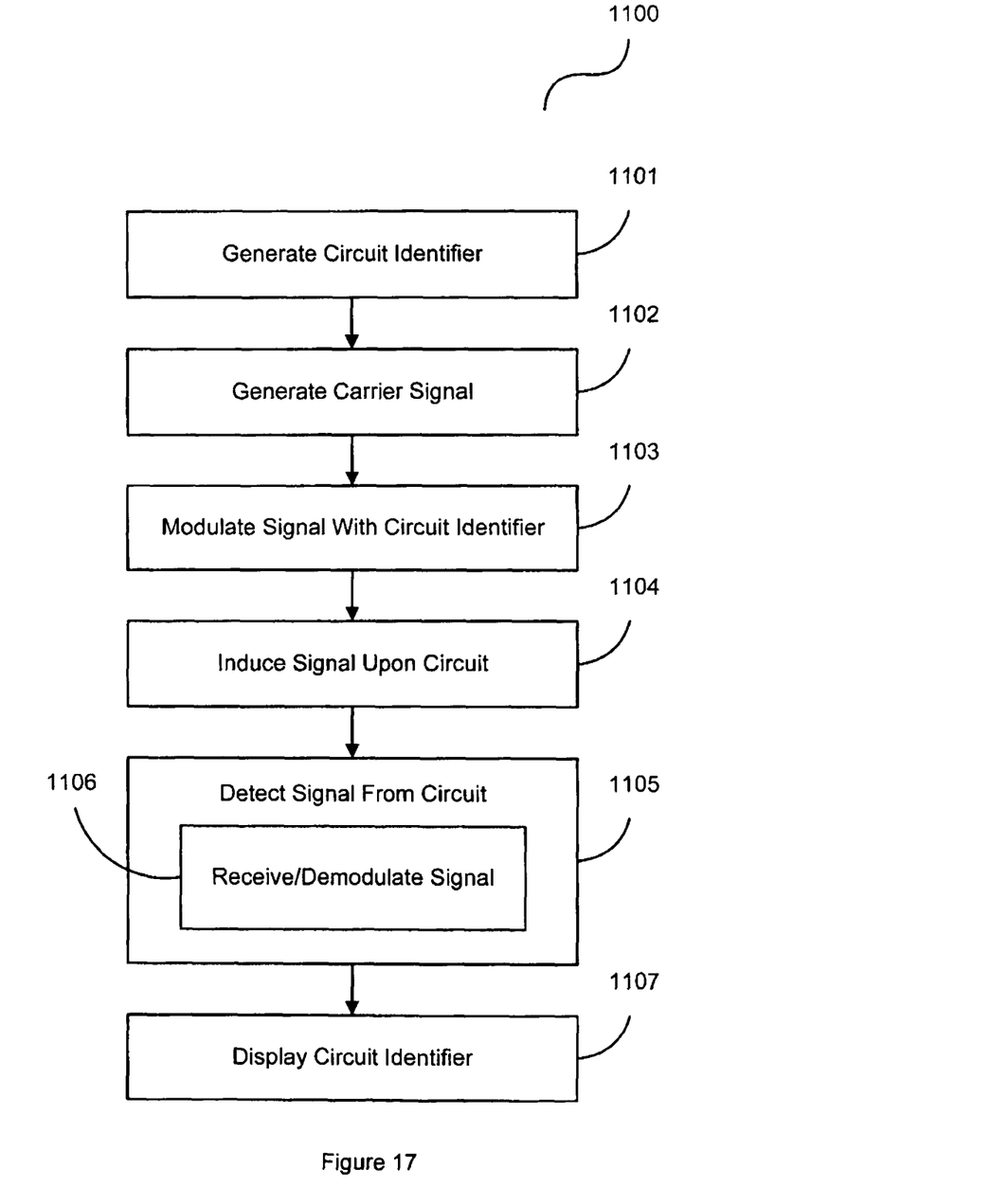
FIG. 17 is a flowchart of an operation of the circuit mapping system, in one exemplary methodical embodiment of the invention.

FIG. 17 is a flowchart of an operation 1100 of the circuit mapping system, such as CMS 100 of FIG. 1, in one exemplary methodical embodiment of the invention. In this embodiment, a circuit indicator is generated, in element 1101. For example, a transmitter, such as transmitter 600 of FIG. 6, may generate a circuit indicator corresponding to an output of the transmitter. The transmitter may also generate a carrier signal, in element 1102. The transmitter may then modulate the carrier signal with the circuit indicator, in element 1103. In one embodiment, the circuit indicator is an ASCII number corresponding to a numbered output of the transmitter. The modulated signal may then be induced upon a circuit line, in element 1104. While general reference is made to a circuit line, those skilled in the art should readily recognize that the signal may be induced upon other electrically conductive lines, such as communication lines, power lines, plumbing, etc.

With the signal induced upon the circuit line, a signal may be detected at a distal point from the transmission (e.g., where the signal was induced), in element 1105. For example, the transmitter may be coupled at a central distribution point such as a breaker box. A receiver, such as receiver 700 of FIG. 7, may be used at another location to receive the induced signal. The receiver may then demodulate the signal, in element 1106. The demodulated signal may then be processed and subsequently displayed, in element 1107. For example, the receiver may display the circuit indicator with a display unit such as an LCD or an LED.

While the invention has been illustrated and described in detail in the drawings and foregoing description, such illustration and description is to be considered as exemplary and not restrictive in character. Accordingly, it should be understood that only the preferred embodiment and minor variants thereof have been shown and described and that all changes and modifications that come within the spirit of the invention are desired to be protected.

What is claimed is:

1. A system operable to correlate a plurality of electrical lines at a central distribution point with a plurality of electrical line outlets, wherein the central distribution point is operable to receive three-phase power and to distribute single-phase power through each of the electrical lines, the system comprising:

a transmitter having a plurality of outputs, wherein each output comprises a coupling clip that is operable to inductively couple to a corresponding one of the electrical lines at the central distribution point of the electrical lines, wherein the transmitter is operable to generate a plurality of unique identifiers, and to inductively transmit each unique identifier from a corresponding output of the transmitter along its corresponding electrical line to inductively label its corresponding electrical line with a corresponding unique identifier;

a three-phase balancer operable to couple to the central distribution point of the electrical lines to filter noise associated with the three-phase power from the each of the electrical lines; and a mobile receiver operable to detect a first unique identifier of the unique identifiers at a first outlet of the electrical line outlets when the mobile receiver is positioned proximate to the first outlet, wherein the first outlet is connected to a first electrical line of the plurality of electrical lines, and to detect a second unique identifier of the unique identifiers at a second outlet of the electrical line outlets when the mobile receiver is positioned proximate to the second outlet, wherein the second outlet is connected to a second electrical line of the plurality of electrical lines.

2. The system of claim 1, wherein the three-phase balancer is further operable to discharge electrical energy when the three-phase balancer is decoupled from the central distribution point to prevent electrical shock to an operator.

3. The system of claim 2, wherein the three-phase balancer comprises a capacitor for each phase of the three-phase power to filter high frequency noise associated with the three-phase power from the each of the electrical lines.

4. The system of claim 3, wherein the three-phase balancer further comprises a resistor at each of the capacitors to discharge the electrical energy from the capacitors when the three-phase balancer is decoupled from the central distribution point to prevent electrical shock to an operator.

5. A method for correlating a plurality of electrical lines at a central distribution point with a plurality of electrical line outlets, wherein the central distribution point is operable to receive three-phase power and to distribute single-phase power through each of the electrical lines, the method comprising:

inductively coupling a plurality of transmitter outputs, each output comprising a coupling clip, to corresponding ones of the electrical lines at the central distribution point of the electrical lines, generating a unique identifier for each output;

inductively transmitting each unique identifier from its corresponding output along its corresponding electrical line to inductively label its corresponding electrical line with a corresponding unique identifier;

filtering noise associated with the three-phase power from the each of the electrical lines with a three-phase balancer coupled to the central distribution point of the electrical lines; and positioning a mobile receiver at a first outlet of the electrical line outlets to detect a first unique identifier of the unique identifiers at the first outlet, wherein the first outlet is connected to a first electrical line of the plurality of electrical lines; and positioning the mobile receiver at a second outlet of the electrical line outlets to detect a second unique identifier of the unique identifiers at the second outlet, wherein the second outlet is connected to a second electrical line of the plurality of electrical lines.

6. The method of claim 5, further comprising:

decoupling three-phase balancer from the central distribution point; and discharging electrical energy from the three-phase balancer, during said decoupling, to prevent electrical shock to an operator.

7. The method of claim 6, wherein filtering noise comprises:

filtering high frequency noise associated with the three-phase power from the each of the electrical lines with a capacitor for each phase of the three-phase power.

8. The method of claim 7, wherein discharging electrical energy from the three-phase balancer comprises:

discharging the electrical energy from each of the capacitors with a corresponding resistor at each capacitor when the three-phase balancer is decoupled from the central distribution point.

* * * * *